United States Patent
Pan et al.

(10) Patent No.: US 8,397,123 B2
(45) Date of Patent: Mar. 12, 2013

(54) RECURSIVE REALIZATION OF POLYNOMIAL PERMUTATION INTERLEAVING

(75) Inventors: Hanfang Pan, San Diego, CA (US);
Michael A. Howard, Cardiff, CA (US);
Yongbin Wei, San Diego, CA (US);
Michael A. Kongelf, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 491 days.

(21) Appl. No.: 12/571,319

(22) Filed: Sep. 30, 2009

(65) Prior Publication Data
US 2011/0075615 A1    Mar. 31, 2011

(51) Int. Cl.
*H03M 13/00* (2006.01)
(52) U.S. Cl. ........ 714/755; 714/751; 714/752; 714/759; 714/781; 711/209; 711/218; 711/200; 711/157; 341/81
(58) Field of Classification Search .......................... None
See application file for complete search history.

(56) References Cited

U.S. PATENT DOCUMENTS

| | | | |
|---|---|---|---|
| 2003/0140304 A1* | 7/2003 | Hurt et al. ..................... | 714/786 |
| 2003/0221084 A1* | 11/2003 | Zhou ............................. | 711/209 |
| 2004/0064666 A1* | 4/2004 | Bickerstaff .................... | 711/200 |
| 2006/0109158 A1* | 5/2006 | Ettorre ......................... | 341/159 |
| 2007/0061667 A1* | 3/2007 | Lin ............................... | 714/755 |
| 2009/0138668 A1 | 5/2009 | Blankenship | |
| 2009/0327843 A1* | 12/2009 | Palanki et al. ................. | 714/776 |
| 2010/0020736 A1* | 1/2010 | Tang ............................. | 370/312 |
| 2012/0063380 A1* | 3/2012 | Tang ............................. | 370/312 |

OTHER PUBLICATIONS

Asghar R, et al., "Dual standard re-configurable hardware interleaver for turbo decoding", Proc. 3rd International Symposium on Wireless Pervasive Computing 2008 (ISWPC 2008), IEEE, Piscataway, N J, USA, May 7, 2008, pa.cles 768-772, XP031281345, ISBN: 978-1-4244-1652-3 p. 769; figure 2.*
Ericsson: "Quadratic Permutation Polynomial Interleavers for LTE Turbo Coding",3GPP Draft; R1-063137, 3rd Generation Partnership Project (3GPP), Mobile Competence Centre; 650, Route Des Lucioles; F-06921 Sophia-Antipolis Cedex; France, vol. RAN WG1, No. Riga, Latvia; Nov. 1, 2006, XP050103593, [retrieved on 2006-11-0.*
Ji-Hoon Kim, et al., "A unified parallel radix-4 turbo decoder for mobile WiMAX and 3GPP-LTE", Proc. IEEE Custom Integrated Circuits Conference 2009 (CICC '09), IEEE, Piscataway, N J, USA, Sep. 13, 2009, pp. 487-490, XP031542638, ISBN: 978-1-4244-4071-9.*
Yang Sun, et al., "Configurable and scalable high throughput turbo decoder architecture for multiple 4G wireless standards", Proc. International Conference on Application-Specific Systems, Architectures and Processors 2008 (ASAP 2008), IEEE, Piscataway, N J, USA, Jul. 2, 2008, pa.cles 209-214, XP031292402, ISBN 978-1-4244-1897-8.*

(Continued)

*Primary Examiner* — John Trimmings
(74) *Attorney, Agent, or Firm* — Peter A. Clevenger

(57) ABSTRACT

Systems and methodologies are described that facilitate automatically generating interleaved addresses during turbo decoding. An efficient recursive technique can be employed in which layers of nested loops enable the computation of a polynomial and a modular function given interleaved parameters "a" and "b" from a look up table. With the recursive technique, interleaved addresses can be generated, one interleaved address per clock cycle which can maintain turbo decoding performance.

40 Claims, 10 Drawing Sheets

OTHER PUBLICATIONS

Asghar R, et al., "Dual standard re-configurable hardware interleaver for turbo decoding", Proc. 3rd International Symposium on Wireless Pervasive Computing 2008 (ISWPC 2008), IEEE, Piscataway, NJ, USA, May 7, 2008, pp. 768-772, XP031281345, ISBN: 978-1-4244-1652-3 p. 769; figure 2.

Ericsson: "Quadratic Permutation Polynomial Interleavers for LTE Turbo Coding", 3GPP Draft; R1-063137, 3rd Generation Partnership Project (3GPP), Mobile Competence Centre; 650, Route Des Lucioles; F-06921 Sophia-Antipolis Cedex; France, vol. RAN WG1, No. Riga, Latvia; 20061101, Nov. 1, 2006, XP050103593, [retrieved on Nov. 1, 2006].

International Search Report and Written Opinion—PCT/US2010/050979—ISA/EPO—Apr. 27, 2011.

Ji-Hoon Kim, et al., "A unified parallel radix-4 turbo decoder for mobile WiMAX and 3GPP-LTE", Proc. IEEE Custom Integrated Circuits Conference 2009 (CICC '09), IEEE, Piscataway, NJ, USA, Sep. 13, 2009, pp. 487-490, XP031542638, ISBN: 978-1-4244-4071-9.

Yang Sun, et al., "Configurable and scalable high throughput turbo decoder architecture for multiple 4G wireless standards", Proc. International Conference on Application-Specific Systems, Architectures and Processors 2008 (ASAP 2008), IEEE, Piscataway, NJ, USA, Jul. 2, 2008, pp. 209-214, XP031292402, ISBN: 978-1-4244-1897-8.

* cited by examiner

RECURSIVE REALIZATION OF POLYNOMIAL PERMUTATION INTERLEAVING

BACKGROUND

I. Field

The following description relates generally to wireless communications, and more particularly to generating interleaved addresses in wireless communication networks.

II. Background

Wireless communication systems are widely deployed to provide various types of communication; for instance, voice and/or data can be provided via such wireless communication systems. A typical wireless communication system, or network, can provide multiple users access to one or more shared resources (e.g., bandwidth, transmit power, . . . ). For instance, a system can use a variety of multiple access techniques such as Frequency Division Multiplexing (FDM), Time Division Multiplexing (TDM), Code Division Multiplexing (CDM), Orthogonal Frequency Division Multiplexing (OFDM), and others.

Generally, wireless multiple-access communication systems can simultaneously support communication for multiple mobile devices. Each mobile device can communicate with one or more base stations via transmissions on forward and reverse links. The forward link (or downlink) refers to the communication link from base stations to mobile devices, and the reverse link (or uplink) refers to the communication link from mobile devices to base stations.

Wireless communication systems oftentimes employ one or more base stations that provide a coverage area. A typical base station can transmit multiple data streams for broadcast, multicast and/or unicast services, wherein a data stream may be a stream of data that can be of independent reception interest to a mobile device. A mobile device within the coverage area of such base station can be employed to receive one, more than one, or all the data streams carried by the composite stream. Likewise, a mobile device can transmit data to the base station or another mobile device.

Wireless communications have adopted a quadratic polynomial permutation interleaving mechanism for turbo encoding/decoding, typically of the format $f(x)=(ax+bx^2) \mod N$. Conventional techniques leverage either a look up table or brute force calculations. While using a look up table or ROM, the amount of memory to store the pre-calculated interleaved addresses is extremely large. In addition, a brute force calculation can lead to stalling and hindered performance. Thus, both the look up table and the brute force calculations are inefficient and not viable techniques to solve the polynomial and modular function in order to generate interleaved addresses.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to related aspects, a method that facilitates generating an interleaved address in real time per clock cycle. The method can include receiving a first parameter (a) and a second parameter (b), wherein a and b are positive numbers related to interleaved parameters in a look-up-table (LUT). The method can further include solving a polynomial during turbo decoding to calculate an interleaved address, the polynomial is of order K, wherein the polynomial is solved with a recursive technique that includes a K number of layers of nested loops. The method can comprise generating the interleaved address per clock cycle by exploitation of an incremental change of an input of the polynomial.

Another aspect relates to a wireless communications apparatus. The wireless communications apparatus can include at least one processor configured to receive a first parameter (a) and a second parameter (b), wherein a and b are positive numbers related to interleaved parameters in a look-up-table (LUT), solve a polynomial during turbo decoding to calculate an interleaved address, the polynomial is of order K, wherein the polynomial is solved with a recursive technique that includes a K number of layers of nested loops, and generate the interleaved address per clock cycle by exploitation of an incremental change of an input of the polynomial. Further, the wireless communications apparatus can include memory coupled to the at least one processor.

Yet another aspect relates to a wireless communications apparatus that enables generating an interleaved address in real time per clock cycle. The wireless communications apparatus can include means for receiving a first parameter (a) and a second parameter (b), wherein a and b are positive numbers related to interleaved parameters in a look-up-table (LUT). Additionally, the wireless communications apparatus can comprise means for solving a polynomial during turbo decoding to calculate an interleaved address, the polynomial is of order K, wherein the polynomial is solved with a recursive technique that includes a K number of layers of nested loops. The wireless communications apparatus can comprise means for generating the interleaved address per clock cycle by exploitation of an incremental change of an input of the polynomial.

Still another aspect relates to a computer program product comprising a computer-readable medium having stored thereon code for causing at least one computer to receive a first parameter (a) and a second parameter (b), wherein a and b are positive numbers related to interleaved parameters in a look-up-table (LUT), code for causing at least one computer to solve a polynomial during turbo decoding to calculate an interleaved address, the polynomial is of order K, wherein the polynomial is solved with a recursive technique that includes a K number of layers of nested loops, and code for causing at least one computer to generate the interleaved address per clock cycle by exploitation of an incremental change of an input of the polynomial.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments can be employed and the described embodiments are intended to include all such aspects and their equivalents.

DETAILED DESCRIPTION

Figure 1:
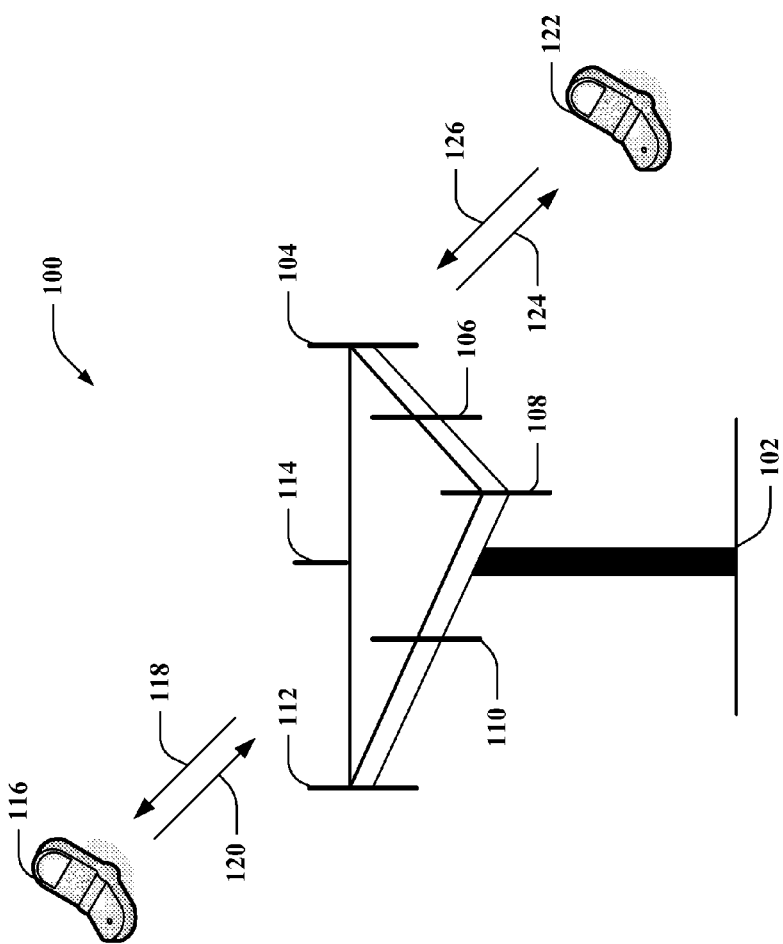
FIG. 1 is an illustration of a wireless communication system in accordance with various aspects set forth herein.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiment(s) may be practiced without these specific details. In other instances, well-known structures and devices are shown in block diagram form in order to facilitate describing one or more embodiments.

As used in this application, the terms "module," "component," "system," and the like are intended to refer to a computer-related entity, either hardware, firmware, a combination of hardware and software, software, or software in execution. For example, a component can be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

The techniques described herein can be used for various wireless communication systems such as code division multiple access (CDMA), time division multiple access (TDMA), frequency division multiple access (FDMA), orthogonal frequency division multiple access (OFDMA), single carrier-frequency division multiple access (SC-FDMA) and other systems. The terms "system" and "network" are often used interchangeably. A CDMA system can implement a radio technology such as Universal Terrestrial Radio Access (UTRA), CDMA2000, etc. UTRA includes Wideband-CDMA (W-CDMA) and other variants of CDMA. CDMA2000 covers IS-2000, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is an upcoming release that uses E-UTRA, which employs OFDMA on the downlink and SC-FDMA on the uplink.

Single carrier frequency division multiple access (SC-FDMA) utilizes single carrier modulation and frequency domain equalization. SC-FDMA has similar performance and essentially the same overall complexity as those of an OFDMA system. A SC-FDMA signal has lower peak-to-average power ratio (PAPR) because of its inherent single carrier structure. SC-FDMA can be used, for instance, in uplink communications where lower PAPR greatly benefits access terminals in terms of transmit power efficiency. Accordingly, SC-FDMA can be implemented as an uplink multiple access scheme in 3GPP Long Term Evolution (LTE) or Evolved UTRA.

Furthermore, various embodiments are described herein in connection with a mobile device. A mobile device can also be called a system, subscriber unit, subscriber station, mobile station, mobile, remote station, remote terminal, access terminal, user terminal, terminal, wireless communication device, user agent, user device, or user equipment (UE). A mobile device can be a cellular telephone, a cordless telephone, a Session Initiation Protocol (SIP) phone, a wireless local loop (WLL) station, a personal digital assistant (PDA), a handheld device having wireless connection capability, computing device, or other processing device connected to a wireless modem. Moreover, various embodiments are described herein in connection with a base station. A base station can be utilized for communicating with mobile device (s) and can also be referred to as an access point, Node B, or some other terminology.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data.

Referring now to FIG. 1, a wireless communication system 100 is illustrated in accordance with various embodiments presented herein. System 100 comprises a base station 102 that can include multiple antenna groups. For example, one antenna group can include antennas 104 and 106, another group can comprise antennas 108 and 110, and an additional group can include antennas 112 and 114. Two antennas are illustrated for each antenna group; however, more or fewer antennas can be utilized for each group. Base station 102 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 102 can communicate with one or more mobile devices such as mobile device 116 and mobile device 122; however, it is to be appreciated that base station 102 can communicate with substantially any number of mobile devices similar to mobile devices 116 and 122. Mobile devices 116 and 122 can be, for example, cellular phones, smart phones, laptops, handheld communication devices, handheld computing devices, satellite radios, global positioning systems, PDAs, and/or any other suitable device for communicating over wireless communication system 100. As depicted, mobile device 116 is in communication with antennas 112 and 114, where antennas 112 and 114 transmit information to mobile device 116 over a forward link 118 and receive information from mobile device 116 over a reverse link 120. Moreover, mobile device 122 is in communication with antennas 104 and 106, where antennas 104 and 106 transmit information to mobile device 122 over a forward link 124 and receive information from mobile device 122 over a reverse link 126. In a frequency division duplex (FDD) system, forward link 118 can utilize a different frequency band than that used by reverse link 120, and forward link 124 can employ a different frequency band than that employed by reverse link 126, for example. Further, in a time division duplex (TDD) system, forward link 118 and reverse link 120 can utilize a common frequency band and forward link 124 and reverse link 126 can utilize a common frequency band.

Each group of antennas and/or the area in which they are designated to communicate can be referred to as a sector of base station 102. For example, antenna groups can be designed to communicate to mobile devices in a sector of the areas covered by base station 102. In communication over forward links 118 and 124, the transmitting antennas of base station 102 can utilize beamforming to improve signal-to-noise ratio of forward links 118 and 124 for mobile devices 116 and 122. Also, while base station 102 utilizes beamforming to transmit to mobile devices 116 and 122 scattered randomly through an associated coverage, mobile devices in neighboring cells can be subject to less interference as compared to a base station transmitting through a single antenna to all its mobile devices.

Base station 102 (and/or each sector of base station 102) can employ one or more multiple access technologies (e.g., CDMA, TDMA, FDMA, OFDMA, . . . ). For instance, base station 102 can utilize a particular technology for communicating with mobile devices (e.g., mobile devices 116 and 122) upon a corresponding bandwidth. Moreover, if more than one technology is employed by base station 102, each technology can be associated with a respective bandwidth. The technologies described herein can include following: Global System for Mobile (GSM), General Packet Radio Service (GPRS), Enhanced Data Rates for GSM Evolution (EDGE), Universal Mobile Telecommunications System (UMTS), Wideband Code Division Multiple Access (W-CDMA), cdmaOne (IS-95), CDMA2000, Evolution-Data Optimized (EV-DO), Ultra Mobile Broadband (UMB), Worldwide Interoperability for Microwave Access (WiMAX), MediaFLO, Digital Multimedia Broadcasting (DMB), Digital Video Broadcasting-Handheld (DVB-H), etc. It is to be appreciated that the aforementioned listing of technologies is provided as an example and the claimed subject matter is not so limited; rather, substantially any wireless communication technology is intended to fall within the scope of the hereto appended claims.

Base station 102 can employ a first bandwidth with a first technology. Moreover, base station 102 can transmit a pilot corresponding to the first technology on a second bandwidth. According to an illustration, the second bandwidth can be leveraged by base station 102 and/or any disparate base station (not shown) for communication that utilizes any second technology. Moreover, the pilot can indicate the presence of the first technology (e.g., to a mobile device communicating via the second technology). For example, the pilot can use bit(s) to carry information about the presence of the first technology. Additionally, information such as a SectorID of the sector utilizing the first technology, a Carrierindex indicating the first frequency bandwidth, and the like can be included in the pilot.

According to another example, the pilot can be a beacon (and/or a sequence of beacons). A beacon can be an OFDM symbol where a large fraction of the power is transmitted on one subcarrier or a few subcarriers (e.g., small number of subcarriers). Thus, the beacon provides a strong peak that can be observed by mobile devices, while interfering with data on a narrow portion of bandwidth (e.g., the remainder of the bandwidth can be unaffected by the beacon). Following this example, a first sector can communicate via CDMA on a first bandwidth and a second sector can communicate via OFDM on a second bandwidth. Accordingly, the first sector can signify the availability of CDMA on the first bandwidth (e.g., to mobile device(s) operating utilizing OFDM on the second bandwidth) by transmitting an OFDM beacon (or a sequence of OFDM beacons) upon the second bandwidth.

In general, the subject innovation can employ an efficient recursive technique utilized to solve a polynomial and a modular function. A quadratic polynomial permutation interleaving mechanism for turbo encoder/decoder can be implemented within wireless communications. Such polynomial can be of the format $f(x)=(ax+bx^2) \bmod N$. Due to a high throughput requirement, the subject innovation can provide an efficient technique that can calculate an interleaving address per clock cycle per calculation. The technique can utilize recursive and nested loop layers in order to calculate an interleaved address per clock cycle utilizing minimal hardware resources.

Figure 2:
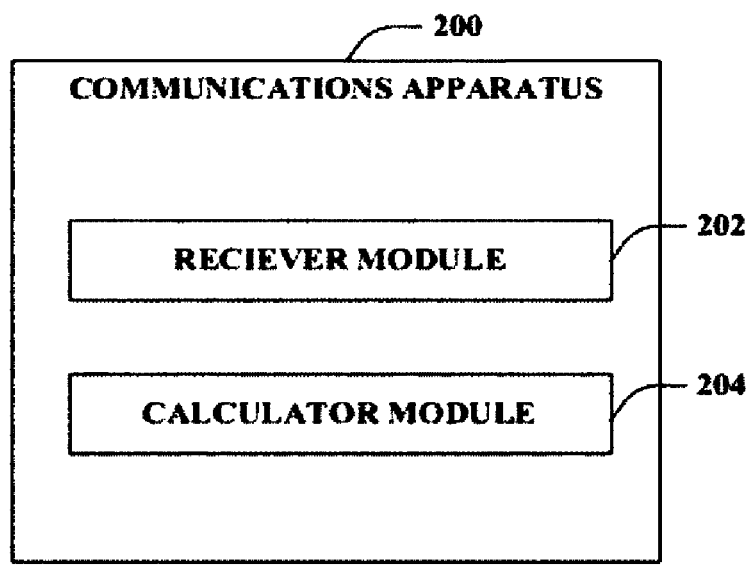
FIG. 2 is an illustration of an example communications apparatus for employment within a wireless communications environment.

Turning to FIG. 2, illustrated is a communications apparatus 200 for employment within a wireless communications environment. The communications apparatus 200 can be a base station or a portion thereof, a mobile device or a portion thereof, or substantially any communications apparatus that receives data transmitted in a wireless communications environment. In communications systems, the communications apparatus 200 employ components described below to efficiently calculate a polynomial and modular function in order to generate interleaved addresses.

The communications apparatus 200 can include a receiver module 202. The receiver module 202 can collect, receive, and/or gather parameters related to a look up table (LUT). For example, the parameters can be associated with the polynomial $f(x)=(ax+bx^2) \bmod N$, wherein "a" and "b" are positive integers and parameters related to an interleaved parameters in a look up table. The communications apparatus can further include a calculator module 204. The calculator module 204 can compute the solution to the polynomial and modular function in order to generate an interleaved address during turbo decoding. In general, the calculator module 204 can leverage a recursive technique with nested loops and layers in order to efficiently calculate the solution to the polynomial and modular function. Based on such calculation by the calculator module 204, an interleaved address can be generated and/or identified.

Moreover, although not shown, it is to be appreciated that communications apparatus 200 can include memory that retains instructions with respect to receiving a first parameter (a) and a second parameter (b), wherein a and b are positive numbers related to interleaved parameters in a look-up-table (LUT), solving a polynomial during turbo decoding to calculate an interleaved address, the polynomial is of order K, wherein the polynomial is solved with a recursive technique that includes a K number of layers of nested loops, generating the interleaved address per clock cycle by exploitation of an incremental change of an input of the polynomial, receiving the interleaved address from at least one of a user equipment, a base station, a serving base station, a target base station, a network, a server, or an eNode B, and the like.

Furthermore, it is to be appreciated that communications apparatus 200 can include memory that retains instructions with respect to receiving a first parameter (a) and a second parameter (b), wherein a and b are positive numbers related to interleaved parameters in a look-up-table (LUT), solving a polynomial during turbo decoding to calculate an interleaved address, the polynomial is of order K, wherein the polynomial is solved with a recursive technique that includes a K number of layers of nested loops, generating the interleaved address per clock cycle by exploitation of an incremental change of an input of the polynomial, transmitting the interleaved address from at least one of a user equipment, a base station, a serving base station, a target base station, a network, a server, or an eNode B, and the like. Further, communications apparatus 200 can include a processor that may be utilized in connection with executing instructions (e.g., instructions retained within memory, instructions obtained from a disparate source, . . . ).

Figure 3:
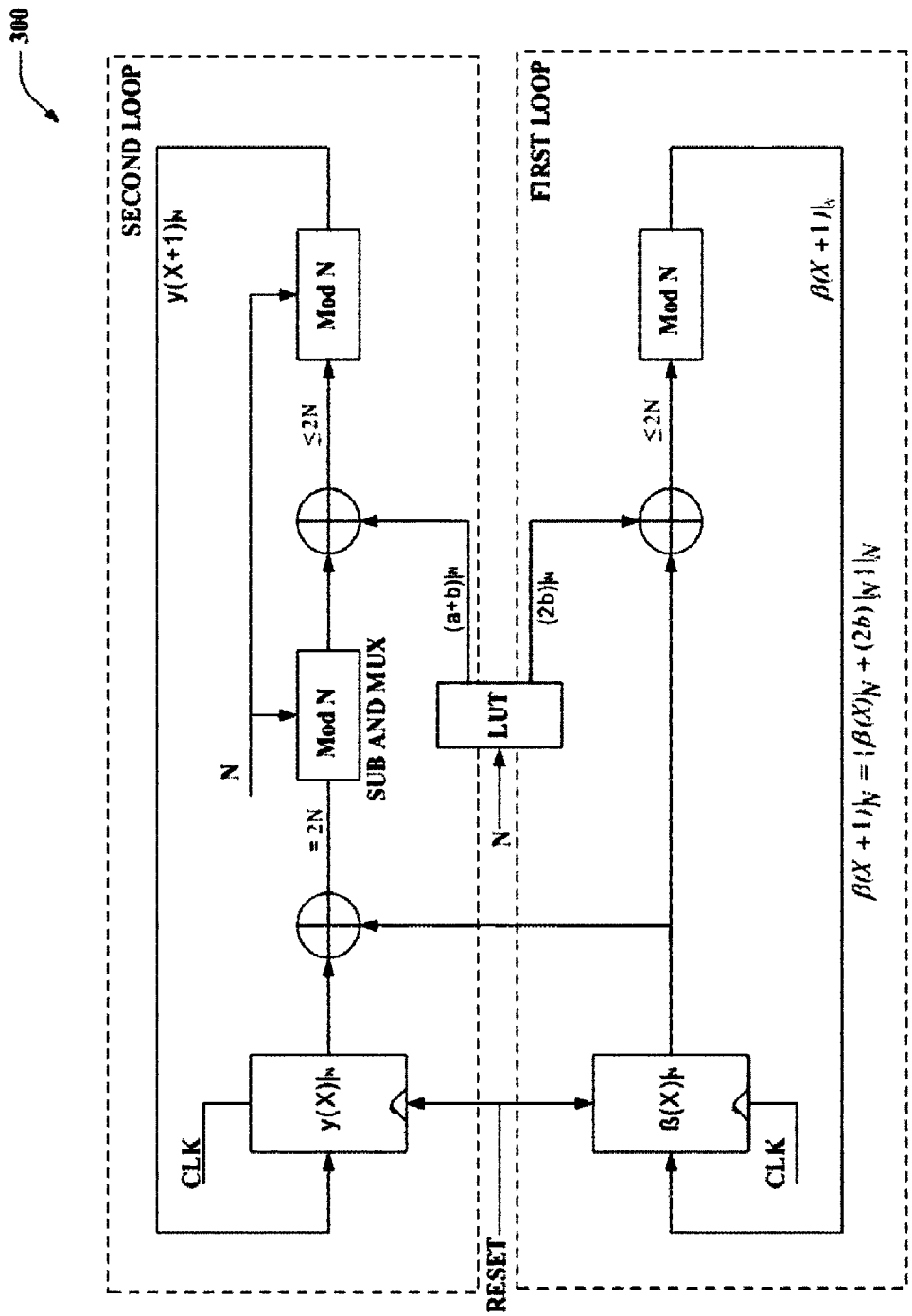
FIG. 3 is an illustration of an example wireless communications system that facilitates generating interleaved addressed by efficiently solving a polynomial and modular function.

Now referring to FIG. 3, illustrated is a wireless communications system 300 that facilitates generating interleaved addressed by efficiently solving a polynomial and modular function. The system 300 can include a first loop 302 and a second loop 304 that provide a recursive technique with layers of nested loops in order to generate interleaved addresses by calculating the polynomial and modular function. For example, the polynomial can be of the format $f(x)=(ax+bx^2)$ mod N, where "a" and "b" are parameters related to a look up table and "N" is a positive integer and relates to a clock counter. As discussed, the system 300 can leverage a K amount of layers of nested loops, wherein K is also the order of the polynomial. For example, a polynomial of the order 6 can include 6 layers of nested loops. In particular, there can be a K−1 amount of the first loop 302 and the second loop 304. For example, if the polynomial is of order 4, there can be three first loops 302 and a second loop 304—first loop A, first loop B, first loop C, and a second loop. Thus, the result from the first loop A from the mod N can be fed as an input into the adder in the next first loop B. Then the result from the first loop B from the mod N can be fed as an input into the adder in the next first loop C. Next, the result from the first loop C mod N can be fed as an input into the adder in the second loop. It is to be appreciated that the system 300 can be modified in order to be employed for any order polynomial, wherein the order of the polynomial (K) can be the amount of layers of nested loops (e.g., the first loop amount being K−1 and the second loop).

Within the first loop 302, a look up table (LUT) can provide "a" and "b" which are parameters related to an interleaved parameters. An adder can add a and b with a first loop clock counter to identify a first result. The clock counter can increment to N, where N is a positive integer. The first result can be an input for a mod N function in order to calculate a first modular result for the polynomial.

Within the second loop 304, the first modular result can be added with a second clock counter to identify a second result. The second result can be an input with N to calculate a second modular result for the polynomial. The second modular result can be added with a and b to produce a third result, wherein the third result can be an input with N to calculate a third modular result. The third modular result can be the interleaved address for the clock cycle N. In other words, the first loop 302 and the second loop 304 can calculate N amount of interleaved addresses for each clock cycle N.

It is to be appreciated that a natural order of information bits into the iterative turbo decoding process can be linear. Based on such linear property, an output can be initialized with '0' and can correspond to an interleaved address of input '0'. The relationship of the interleaved address of the two neighboring inputs can be exploited and a recursive technique is utilized by the subject innovation. Some term of the recursive technique can be another recursive loop. By nesting two recursive loops, the interleaved address can be calculated successively. In general, the recursive technique can be utilized to solve any order of polynomial and modular function by having a number of layered nested loops equal to the order of the polynomial (e.g., order of 3 has 3 loops, order of 4 has 4 loops, etc.). In other words, a polynomial to the 'n' can have a permutation with 'n' nested loops.

The subject innovation can generate interleaved addresses by employing a recursive technique to calculate a polynomial and modular function. The polynomial can be, for example, $f(x)=(ax+bx^2)$ mod N, where "a," and "b" are positive integers that are parameters related to a look up table. Moreover, "N" can be a positive integer related to a clock cycle and x can be any suitable positive integer from 0 to N−1. In one example, the subject innovation can support 188 interleaved sizes N, 40 to 6144. The subject innovation can calculate the interleaved address during turbo decoding. Moreover, the recursive technique can generate an interleaved address such that one address is generated per cycle which can maintain turbo decoding performance.

In general, the claimed subject matter can exploit the incremental change of the polynomial inputs since the natural order to the bits is in linearly increasing order. Additionally, the interleaved addresses can be calculated on the fly recursively. For example, Y(x+1) can be calculated with 2 layers of nested loops. Thus, system 300 provides the following:

$$y(X+1) = a(X+1) + b(X+1)^2$$
$$= aX + bX^2 + 2bX + a + b$$
$$= y(X) + 2bX + a + b$$
$$\rightarrow$$
$$y(X+1)|_N = \{y(X)_N| + (2bX)|_N + (a+b)|_N\}|_N$$
$$= \{y(X)_N| + \beta(X)_N| + (a+b)|_N\}|_N$$

Moreover, the system 300 can be implemented into CRD's dual-MAP turbo decoding architecture. APP RAM access can be collision free. The critical path of the block can be, for example, 2 adders+2 subtractors+2 muxes. For K=2 and K=−2, the radix 4 implementation can utilize a look up table for each case, wherein the total size of the look up tables is 188*13*2*2=9776 bits (small amount). Moreover, the claimed subject matter can be extrapolated beyond a quadratic polynomial permutation. For instance, $y(x)=(ax+bx^2+cx^3)$ mod N can be recursively solved with 3 nested loops and 3 stages within each clock. Thus, as mentioned above, the system 300 can be utilized to solve a polynomial using a number of loops, wherein the number of loops is equal to the order of the polynomial.

Figure 4:
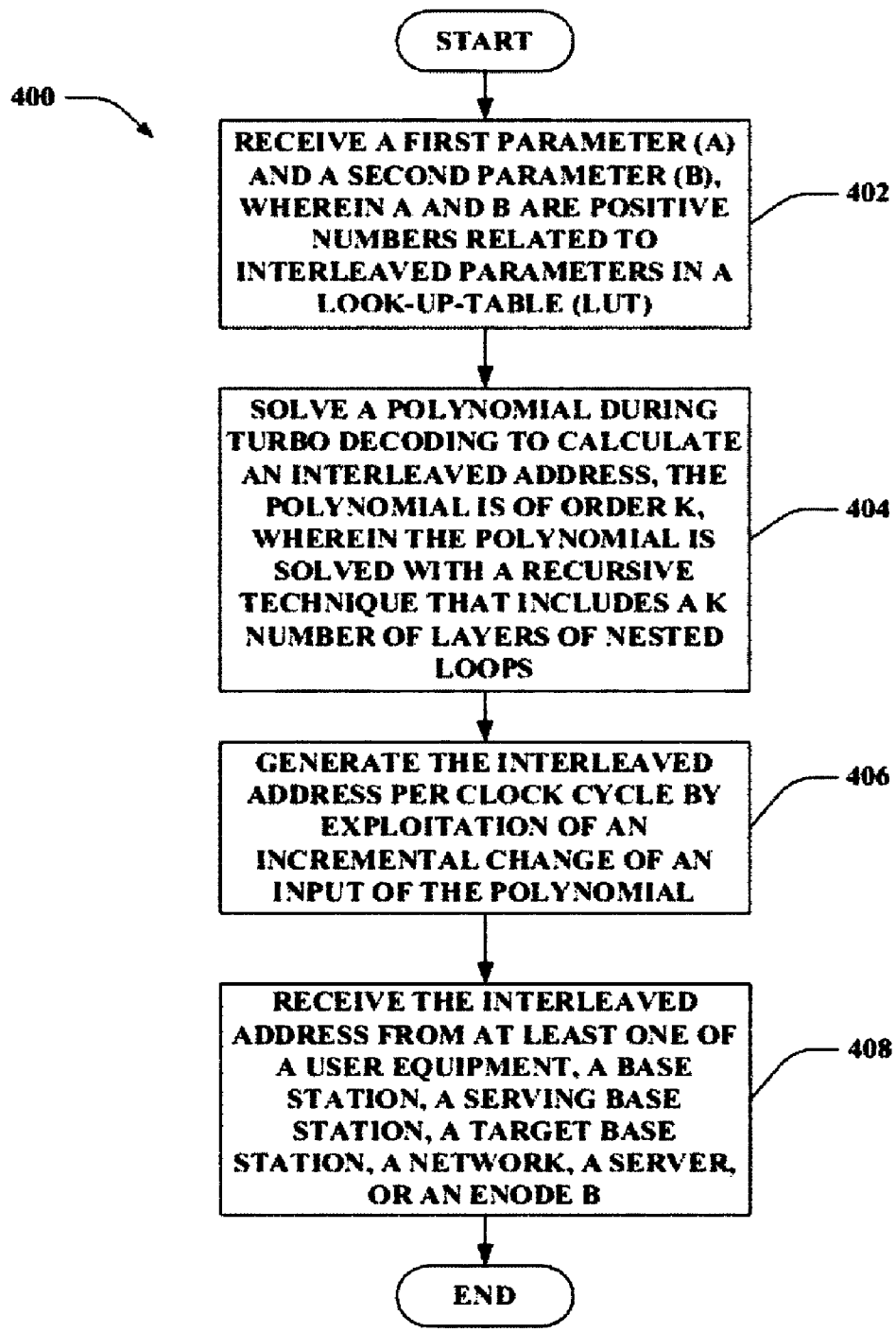
FIG. 4 is an illustration of an example methodology that calculates an interleaved address in a clock cycle with a recursive technique that includes layers of nested loops.
Figure 5:
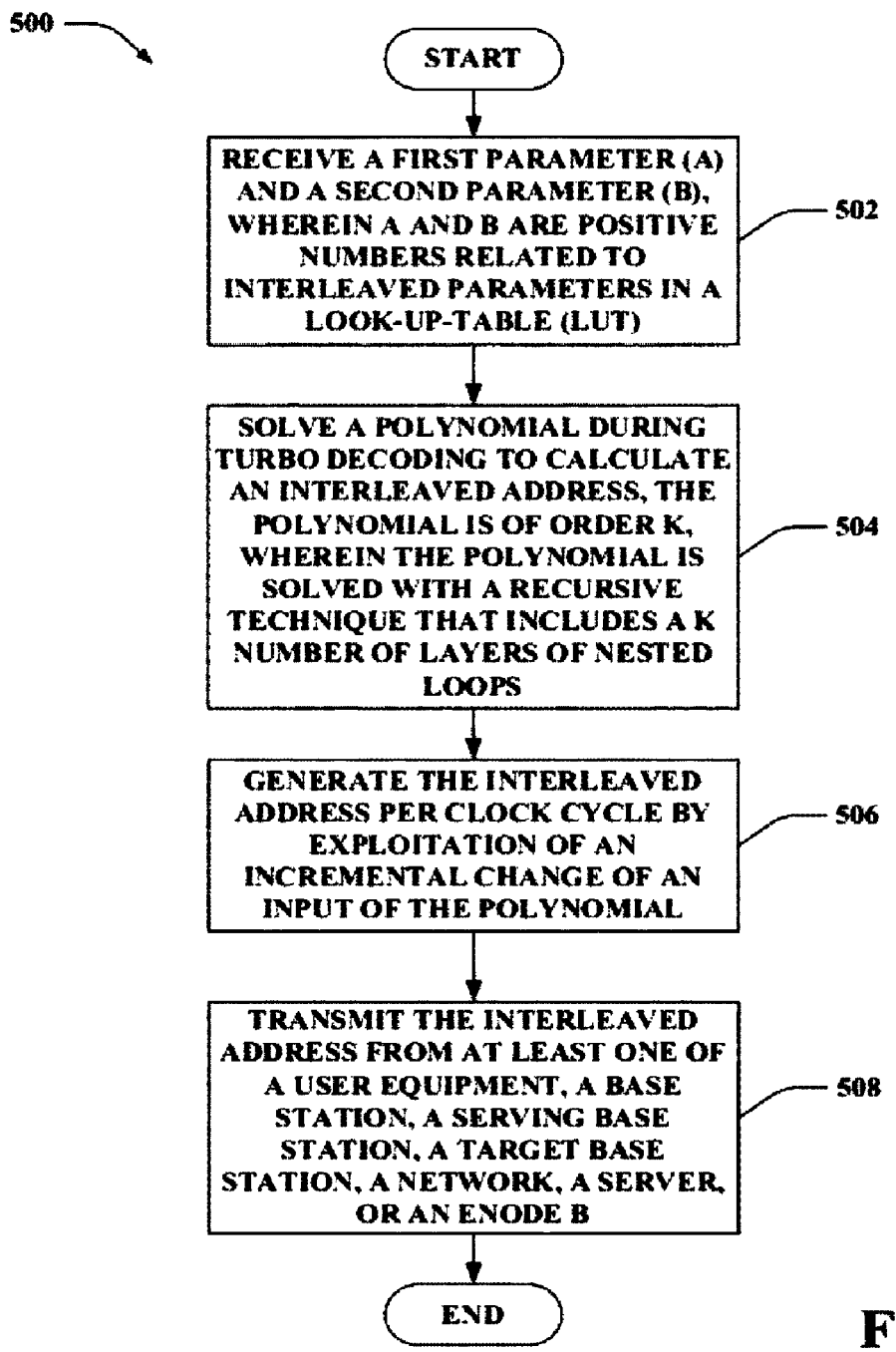
FIG. 5 is an illustration of an example methodology that generates interleaved addresses by recursively solving a polynomial and modular function.

Referring to FIGS. 4-5, methodologies relating to configuring a flush timer are illustrated. While, for purposes of simplicity of explanation, the methodologies are shown and described as a series of acts, it is to be understood and appreciated that the methodologies are not limited by the order of acts, as some acts may, in accordance with one or more embodiments, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more embodiments.

Turning to FIG. 4, illustrated is a methodology 400 that facilitates calculating an interleaved address in a clock cycle with a recursive technique that includes layers of nested loops. At reference numeral 402, a first parameter (a) and a second parameter (b) can be received, wherein a and b are positive numbers related to interleaved parameters in a look-up-table (LUT). At reference numeral 404, a polynomial can be solved during turbo decoding to calculate an interleaved address, the polynomial is of order K, wherein the polynomial is solved with a recursive technique that includes a K number of layers of nested loops. At reference numeral 406, the interleaved address can be generated per clock cycle by exploitation of an incremental change of an input of the polynomial. At reference numeral 408, the interleaved address can be received from at least one of a user equipment, a base station, a serving base station, a target base station, a network, a server, or an eNode B.

Now referring to FIG. 5, a methodology 500 that facilitates generating interleaved addresses by recursively solving a polynomial and modular function. At reference numeral 502, a first parameter (a) and a second parameter (b) can be received, wherein a and b are positive numbers related to interleaved parameters in a look-up-table (LUT). At reference numeral 504, a polynomial can be solved during turbo decoding to calculate an interleaved address, the polynomial is of order K, wherein the polynomial is solved with a recursive technique that includes a K number of layers of nested loops. At reference numeral 506, the interleaved address can be generated per clock cycle by exploitation of an incremental change of an input of the polynomial. At reference numeral 508, the interleaved address can be transmitted from at least one of a user equipment, a base station, a serving base station, a target base station, a network, a server, or an eNode B.

Figure 6:
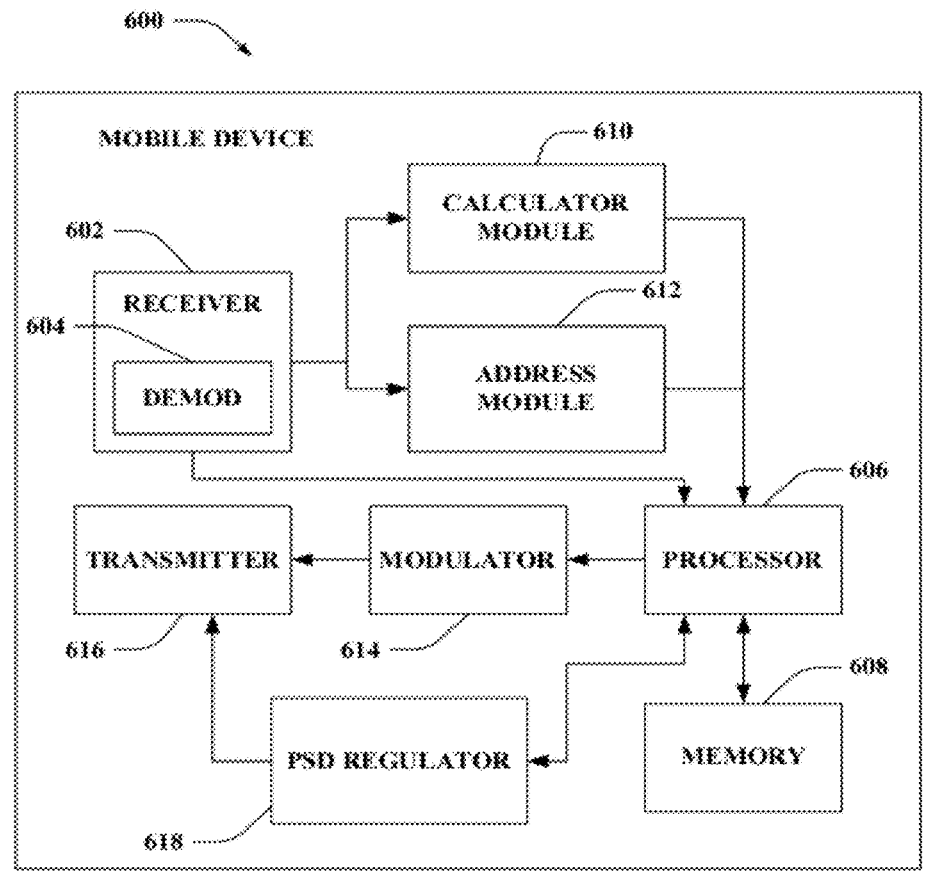
FIG. 6 is an illustration of an example mobile device that facilitates identifying interleaved addresses during turbo decoding in a wireless communication system.

FIG. 6 is an illustration of a mobile device 600 that facilitates supporting uplink inter-cell interference cancellation in a wireless communication system. Mobile device 600 comprises a receiver 602 that receives a signal from, for instance, a receive antenna (not shown), performs typical actions on (e.g., filters, amplifies, downconverts, etc.) the received signal, and digitizes the conditioned signal to obtain samples. Receiver 602 can comprise a demodulator 604 that can demodulate received symbols and provide them to a processor 606 for channel estimation. Processor 606 can be a processor dedicated to analyzing information received by receiver 602 and/or generating information for transmission by a transmitter 616, a processor that controls one or more components of mobile device 600, and/or a processor that both analyzes information received by receiver 602, generates information for transmission by transmitter 616, and controls one or more components of mobile device 600.

Mobile device 600 can additionally comprise memory 608 that is operatively coupled to processor 606 and that can store data to be transmitted, received data, information related to available channels, data associated with analyzed signal and/or interference strength, information related to an assigned channel, power, rate, or the like, and any other suitable information for estimating a channel and communicating via the channel. Memory 608 can additionally store protocols and/or algorithms associated with estimating and/or utilizing a channel (e.g., performance based, capacity based, etc.).

It will be appreciated that the data store (e.g., memory 608) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 608 of the subject systems and methods is intended to comprise, without being limited to, these and any other suitable types of memory.

Processor 606 can further be operatively coupled to at least one of a calculator module 610 or an address module 612. The calculator module 610 can received, collect, and/or gather interleaved parameters related to a look up table and solve a polynomial and modular function. For example, the polynomial and modular function can be, but is not limited to being, $f(x)=(ax+bx^2)$ mod N, wherein "a" and "b" are positive integers and parameters related to an interleaved parameters in a look up table. The address module 612 can employ the computed solutions for the polynomial and the modular function during turbo decoding from each clock cycle N as interleaved addresses. In general, the calculator module 610 and the address module 612 can leverage a recursive technique with nested loops and layers in order to efficiently calculate the solution to the polynomial and modular function and thus generate interleaved addresses. It is to be appreciated that the polynomial can be of any suitable order to which the order can relate to the number of layers of nested loops for the recursive technique.

Mobile device 600 still further comprises a modulator 614 and transmitter 616 that respectively modulate and transmit signals to, for instance, a base station, another mobile device, etc. Although depicted as being separate from the processor 606, it is to be appreciated that the calculator module 610, address module 612, demodulator 604, and/or modulator 614 can be part of the processor 606 or multiple processors (not shown).

Figure 7:
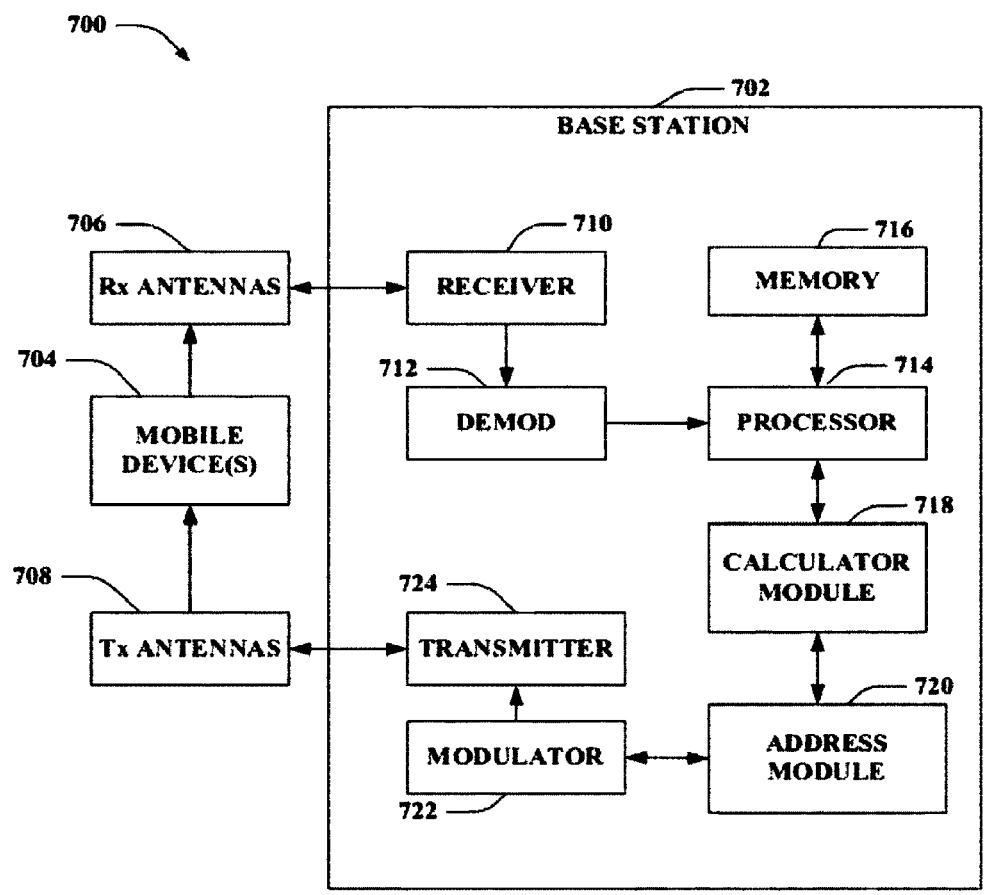
FIG. 7 is an illustration of an example system that facilitates generating an interleaved address during a clock cycle in a wireless communication environment.

FIG. 7 is an illustration of a system 700 that facilitates generating interleaved addresses based upon a recursive calculation technique in a wireless communication environment as described supra. The system 700 comprises a base station 702 (e.g., access point, . . . ) with a receiver 710 that receives signal(s) from one or more mobile devices 704 through a plurality of receive antennas 706, and a transmitter 724 that transmits to the one or more mobile devices 704 through a transmit antenna 708. Receiver 710 can receive information from receive antennas 706 and is operatively associated with a demodulator 712 that demodulates received information. Demodulated symbols are analyzed by a processor 714 that can be similar to the processor described above with regard to FIG. 6, and which is coupled to a memory 716 that stores information related to estimating a signal (e.g., pilot) strength and/or interference strength, data to be transmitted to or received from mobile device(s) 704 (or a disparate base station (not shown)), and/or any other suitable information related to performing the various actions and functions set forth herein.

Moreover, the processor 714 can be coupled to at least one of a calculator module 718 or an address module 720. The calculator module 718 can solve a polynomial and modular function utilizing a recursive technique. In general, the calculator module 718 and the address module 720 can leverage a recursive technique with nested loops and layers in order to efficiently calculate the solution to the polynomial and modular function and thus generate the interleaved addresses. For example, the polynomial and modular function can be, but is not limited to being, $f(x)=(ax+bx^2) \mod N$, wherein "a" and "b" are positive integers and parameters related to an interleaved parameters in a look up table. The address module 720 can employ the computed solutions for the polynomial and the modular function during turbo decoding from each clock cycle N as interleaved addresses. It is to be appreciated that the polynomial can be of any suitable order to which the order can relate to the number of layers of nested loops for the recursive technique.

Furthermore, although depicted as being separate from the processor 714, it is to be appreciated that the calculator module 718, address module 720, demodulator 712, and/or modulator 722 can be part of the processor 714 or multiple processors (not shown).

Figure 8:
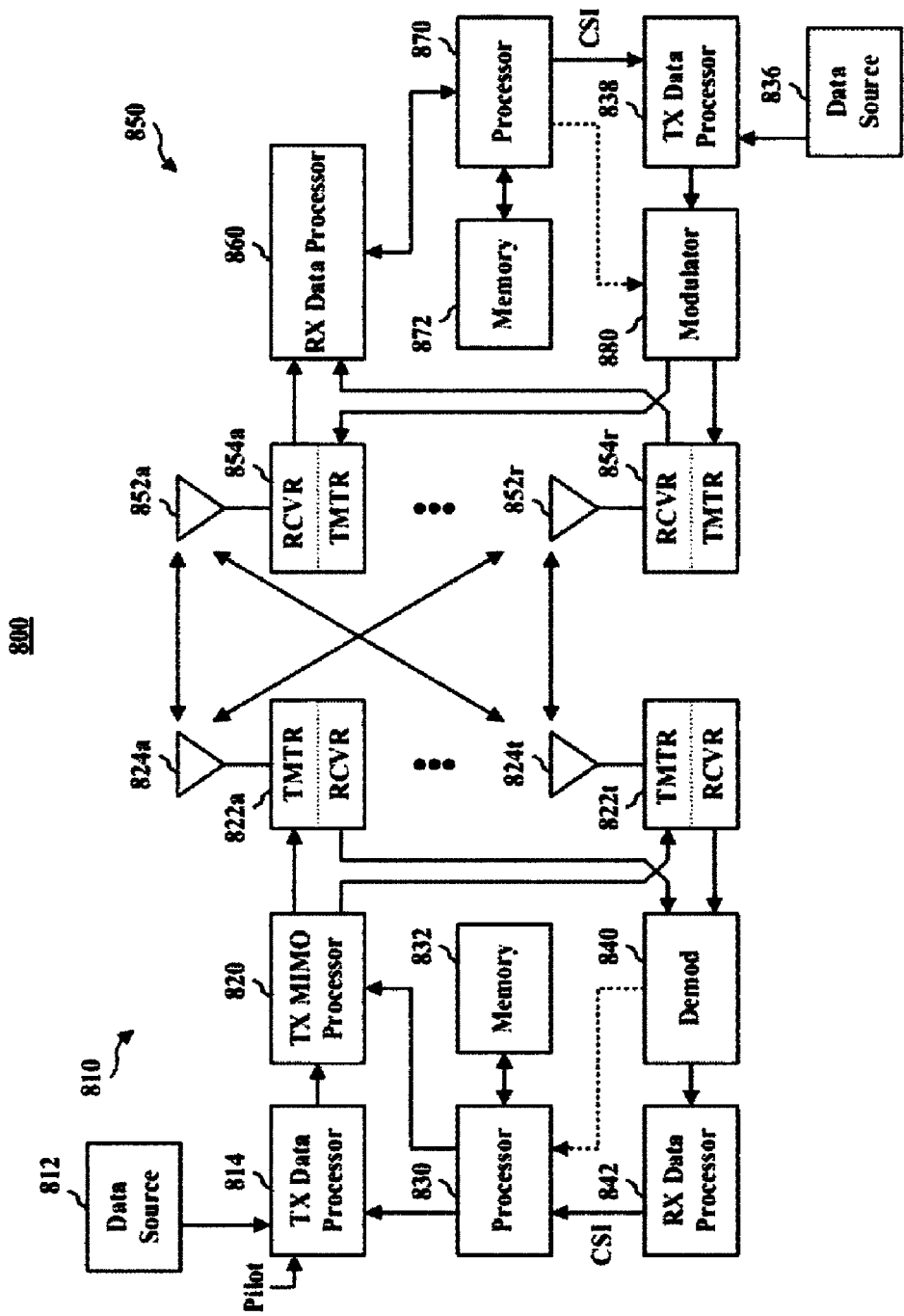
FIG. 8 is an illustration of an example wireless network environment that can be employed in conjunction with the various systems and methods described herein.

FIG. 8 shows an example wireless communication system 800. The wireless communication system 800 depicts one base station 810 and one mobile device 850 for sake of brevity. However, it is to be appreciated that system 800 can include more than one base station and/or more than one mobile device, wherein additional base stations and/or mobile devices can be substantially similar or different from example base station 810 and mobile device 850 described below. In addition, it is to be appreciated that base station 810 and/or mobile device 850 can employ the systems (FIGS. 1-3 and 6-7) and/or methods (FIGS. 4-5) described herein to facilitate wireless communication there between.

At base station 810, traffic data for a number of data streams is provided from a data source 812 to a transmit (TX) data processor 814. According to an example, each data stream can be transmitted over a respective antenna. TX data processor 814 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at mobile device 850 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 830.

The modulation symbols for the data streams can be provided to a TX MIMO processor 820, which can further process the modulation symbols (e.g., for OFDM). TX MIMO processor 820 then provides $N_T$ modulation symbol streams to $N_T$ transmitters (TMTR) 822a through 822t. In various embodiments, TX MIMO processor 820 applies beamforming weights to the symbols of the data streams and to the antenna from which the symbol is being transmitted.

Each transmitter 822 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 822a through 822t are transmitted from $N_T$ antennas 824a through 824t, respectively.

At mobile device 850, the transmitted modulated signals are received by $N_R$ antennas 852a through 852r and the received signal from each antenna 852 is provided to a respective receiver (RCVR) 854a through 854r. Each receiver 854 conditions (e.g., filters, amplifies, and downconverts) a respective signal, digitizes the conditioned signal to provide samples, and further processes the samples to provide a corresponding "received" symbol stream.

An RX data processor 860 can receive and process the $N_R$ received symbol streams from $N_R$ receivers 854 based on a particular receiver processing technique to provide $N_T$ "detected" symbol streams. RX data processor 860 can demodulate, deinterleave, and decode each detected symbol stream to recover the traffic data for the data stream. The processing by RX data processor 860 is complementary to that performed by TX MIMO processor 820 and TX data processor 814 at base station 810.

A processor 870 can periodically determine which precoding matrix to utilize as discussed above. Further, processor 870 can formulate a reverse link message comprising a matrix index portion and a rank value portion.

The reverse link message can comprise various types of information regarding the communication link and/or the received data stream. The reverse link message can be processed by a TX data processor 838, which also receives traffic data for a number of data streams from a data source 836, modulated by a modulator 880, conditioned by transmitters 854a through 854r, and transmitted back to base station 810.

At base station 810, the modulated signals from mobile device 850 are received by antennas 824, conditioned by receivers 822, demodulated by a demodulator 840, and processed by a RX data processor 842 to extract the reverse link message transmitted by mobile device 850. Further, processor 830 can process the extracted message to determine which precoding matrix to use for determining the beamforming weights.

Processors 830 and 870 can direct (e.g., control, coordinate, manage, etc.) operation at base station 810 and mobile device 850, respectively. Respective processors 830 and 870 can be associated with memory 832 and 872 that store program codes and data. Processors 830 and 870 can also perform computations to derive frequency and impulse response estimates for the uplink and downlink, respectively.

It is to be understood that the embodiments described herein can be implemented in hardware, software, firmware, middleware, microcode, or any combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

When the embodiments are implemented in software, firmware, middleware or microcode, program code or code segments, they can be stored in a machine-readable medium, such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

Figure 9:
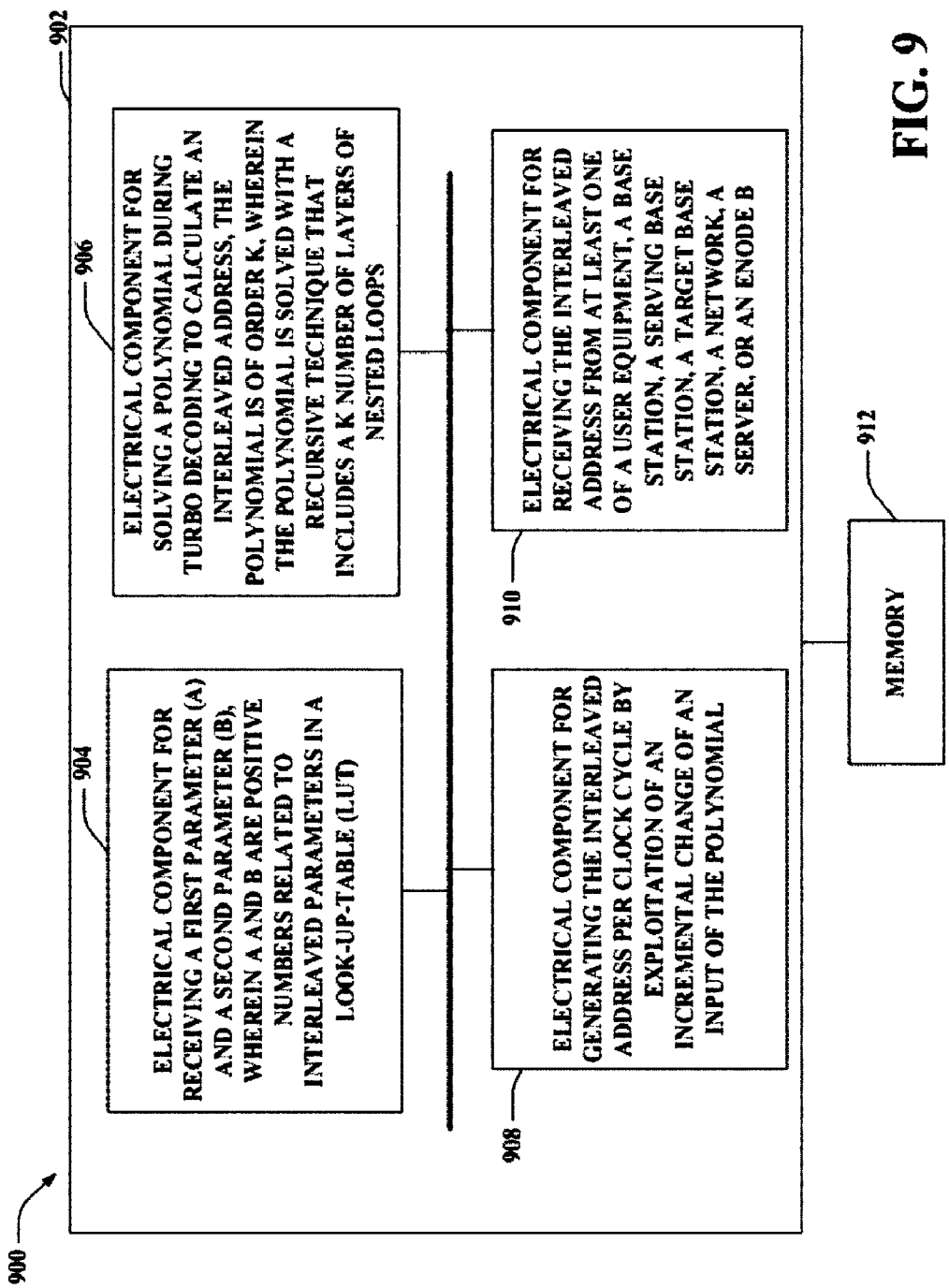
FIG. 9 is an illustration of an example system that facilitates generating interleaved addresses by recursively solving a polynomial and modular function.

With reference to FIG. 9, illustrated is a system 900 that facilitates generating interleaved addresses by recursively solving a polynomial and modular function. For example, system 900 can reside at least partially within a base station, mobile device, etc. It is to be appreciated that system 900 is represented as including functional blocks, which can be functional blocks that represent functions implemented by a processor, software, or combination thereof (e.g., firmware). System 900 includes a logical grouping 902 of electrical components that can act in conjunction. The logical grouping 902 can include an electrical component for receiving a first parameter (a) and a second parameter (b), wherein a and b are positive numbers related to interleaved parameters in a look-up-table (LUT) 904. In addition, the logical grouping 902 can comprise an electrical component for solving a polynomial during turbo decoding to calculate an interleaved address, the polynomial is of order K, wherein the polynomial is solved with a recursive technique that includes a K number of layers of nested loops 906. Moreover, the logical grouping 902 can include an electrical component for generating the interleaved address per clock cycle by exploitation of an incremental change of an input of the polynomial 908. Furthermore, the logical grouping 902 can include an electrical component for receiving the interleaved address from at least one of a user equipment, a base station, a serving base station, a target base station, a network, a server, or an eNode B 910. Additionally, system 900 can include a memory 912 that retains instructions for executing functions associated with electrical components 904, 906, 908, and 910. While shown as being external to memory 912, it is to be understood that one or more of electrical components 904, 906, 908, and 910 can exist within memory 912.

Figure 10:
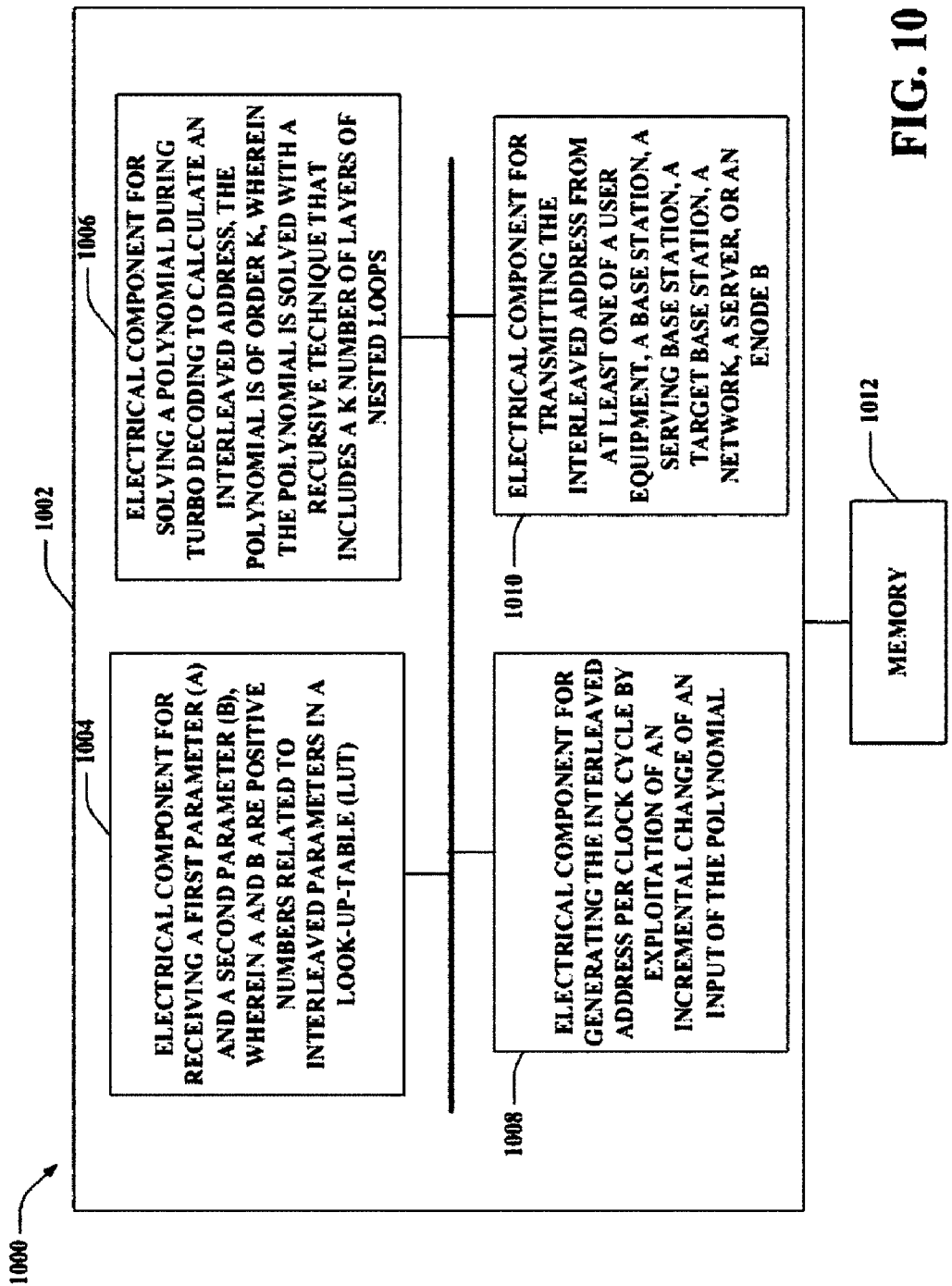
FIG. 10 is an illustration of an example system that can calculate an interleaved address in a clock cycle with a recursive technique that includes layers of nested loops.

Turning to FIG. 10, illustrated is a system 1000 that can calculate an interleaved address in a clock cycle with a recursive technique that includes layers of nested loops. System 1000 can reside within a base station, mobile device, etc., for instance. As depicted, system 1000 includes functional blocks that can represent functions implemented by a processor, software, or combination thereof (e.g., firmware). System 1000 includes a logical grouping 1002 of electrical components that facilitate efficiently generating an interleaved address during a clock cycle. The logical grouping 1002 can include an electrical component for receiving a first parameter (a) and a second parameter (b), wherein a and b are positive numbers related to interleaved parameters in a look-up-table (LUT) 1004. In addition, the logical grouping 1002 can comprise an electrical component for solving a polynomial during turbo decoding to calculate an interleaved address, the polynomial is of order K, wherein the polynomial is solved with a recursive technique that includes a K number of layers of nested loops 1006. Furthermore, the logical grouping 1002 can include an electrical component for generating the interleaved address per clock cycle by exploitation of an incremental change of an input of the polynomial 1008. Moreover, the logical grouping 1002 can include an electrical component for transmitting the interleaved address to at least one of a user equipment, a base station, a serving base station, a target base station, a network, a server, or an eNode 1010. Additionally, system 1000 can include a memory 1012 that retains instructions for executing functions associated with electrical components 1004, 1006, 1008, and 1010. While shown as being external to memory 1012, it is to be understood that electrical components 1004, 1006, 1008, and 1010 can exist within memory 1012.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method that facilitates generating an interleaved address in real time per clock cycle, comprising:
   receiving a first parameter (a) and a second parameter (b), wherein a and b are positive numbers related to interleaved parameters in a look-up-table (LUT);
   solving a polynomial during turbo decoding to calculate an interleaved address, the polynomial is of order K, wherein the polynomial is solved with a recursive technique that includes a K number of layers of nested loops; and
   generating the interleaved address per clock cycle by exploitation of an incremental change of an input of the polynomial.

2. The method of claim 1, further comprising:
   employing a first loop that includes:
      adding a and b with a first loop clock counter to identify a first result, the clock counter increments to N, N is a positive integer; and
      utilizing the first result as an input to calculate a first modular result for the polynomial; and
   employing a second loop that includes:
      adding the first modular result with a second loop clock counter to identify a second result;
      utilizing the second result as an input with N to calculate a second modular result for the polynomial;
      adding the second modular result with a and b to produce a third result;

utilizing the third result as an input with N to calculate a third modular result; and employing the third modular result as the interleaved address for the clock cycle N.

3. The method of claim 2, further comprising utilizing K−1 number of first loops and the second loop, where K is the order of the polynomial.

4. The method of claim 2, further comprising calculating N amount of interleaved addresses for each clock cycle N.

5. The method of claim 1, wherein the polynomial is [ax+bx$^2$] mod N and K is 2.

6. The method of claim 1, wherein N is an integer between 40 and 6144.

7. The method of claim 1, further comprising receiving the interleaved address to at least one of a user equipment, a base station, a serving base station, a target base station, a network, a server, or an eNode B.

8. The method of claim 1, further comprising transmitting the interleaved address to at least one of a user equipment, a base station, a serving base station, a target base station, a network, a server, or an eNode B.

9. The method of claim 1, further comprising maintaining turbo decoding performance while generating the interleaved address.

10. The method of claim 1, further comprising:
utilizing the recursive technique with K layers of nested loops to solve the polynomial and a modular function based upon leverage of the a natural order of information bits into the iterative turbo decoding process being linear; and
initializing an output of the information bits to 0 which corresponds to an interleaved address of input 0.

11. A wireless communications apparatus, comprising:
at least one processor configured to:
receive a first parameter (a) and a second parameter (b), wherein a and b are positive numbers related to interleaved parameters in a look-up-table (LUT);
solve a polynomial during turbo decoding to calculate an interleaved address, the polynomial is of order K, wherein the polynomial is solved with a recursive technique that includes a K number of layers of nested loops; and
generate the interleaved address per clock cycle by exploitation of an incremental change of an input of the polynomial; and
a memory coupled to the at least one processor.

12. The wireless communications apparatus of claim 11, further comprising at least one processor configured to:
employ a first loop that includes:
adding a and b with a first loop clock counter to identify a first result, the clock counter increments to N, N is a positive integer; and
utilizing the first result as an input to calculate a first modular result for the polynomial; and
employ a second loop that includes:
adding the first modular result with a second loop clock counter to identify a second result;
utilizing the second result as an input with N to calculate a second modular result for the polynomial;
adding the second modular result with a and b to produce a third result;
utilizing the third result as an input with N to calculate a third modular result; and
employing the third modular result as the interleaved address for the clock cycle N.

13. The wireless communications apparatus of claim 12, further comprising at least one processor configured to utilize K−1 number of first loops and the second loop, where K is the order of the polynomial.

14. The wireless communications apparatus of claim 12, further comprising at least one processor configured to calculate N amount of interleaved addresses for each clock cycle N.

15. The wireless communications apparatus of claim 11, wherein the polynomial is [ax+bx$^2$] mod N and K is 2.

16. The wireless communications apparatus of claim 11, wherein N is an integer between 40 and 6144.

17. The wireless communications apparatus of claim 11, further comprising at least one processor configured to receive the interleaved address to at least one of a user equipment, a base station, a serving base station, a target base station, a network, a server, or an eNode B.

18. The wireless communications apparatus of claim 11, further comprising at least one processor configured to transmit the interleaved address to at least one of a user equipment, a base station, a serving base station, a target base station, a network, a server, or an eNode B.

19. The wireless communications apparatus of claim 11, further comprising at least one processor configured to maintain turbo decoding performance while generating the interleaved address.

20. The wireless communications apparatus of claim 11, further comprising:
at least one processor configured to:
utilize the recursive technique with K layers of nested loops to solve the polynomial and a modular function based upon leverage of the a natural order of information bits into the iterative turbo decoding process being linear; and
initialize an output of the information bits to 0 which corresponds to an interleaved address of input 0.

21. A wireless communications apparatus that enables generating an interleaved address in real time per clock cycle, comprising:
means for receiving a first parameter (a) and a second parameter (b), wherein a and b are positive numbers related to interleaved parameters in a look-up-table (LUT);
means for solving a polynomial during turbo decoding to calculate an interleaved address, the polynomial is of order K, wherein the polynomial is solved with a recursive technique that includes a K number of layers of nested loops; and
means for generating the interleaved address per clock cycle by exploitation of an incremental change of an input of the polynomial.

22. The wireless communications apparatus of claim 21, further comprising:
means for employing a first loop that includes:
adding a and b with a first loop clock counter to identify a first result, the clock counter increments to N, N is a positive integer; and
utilizing the first result as an input to calculate a first modular result for the polynomial; and
means for employing a second loop that includes:
adding the first modular result with a second loop clock counter to identify a second result;
utilizing the second result as an input with N to calculate a second modular result for the polynomial;
adding the second modular result with a and b to produce a third result;

utilizing the third result as an input with N to calculate a third modular result; and employing the third modular result as the interleaved address for the clock cycle N.

23. The wireless communications apparatus of claim 22, further comprising means for utilizing K−1 number of first loops and the second loop, where K is the order of the polynomial.

24. The wireless communications apparatus of claim 22, further comprising means for calculating N amount of interleaved addresses for each clock cycle N.

25. The wireless communications apparatus of claim 21, wherein the polynomial is [ax+bx$^2$] mod N and K is 2.

26. The wireless communications apparatus of claim 21, wherein N is an integer between 40 and 6144.

27. The wireless communications apparatus of claim 21, further comprising means for receiving the interleaved address to at least one of a user equipment, a base station, a serving base station, a target base station, a network, a server, or an eNode B.

28. The wireless communications apparatus of claim 21, further comprising means for transmitting the interleaved address to at least one of a user equipment, a base station, a serving base station, a target base station, a network, a server, or an eNode B.

29. The wireless communications apparatus of claim 21, further comprising means for maintaining turbo decoding performance while generating the interleaved address.

30. The wireless communications apparatus of claim 21, further comprising:

means for utilizing the recursive technique with K layers of nested loops to solve the polynomial and a modular function based upon leverage of the a natural order of information bits into the iterative turbo decoding process being linear; and means for initializing an output of the information bits to 0 which corresponds to an interleaved address of input 0.

31. A computer program product, comprising:

a computer-readable medium comprising:

code for causing at least one computer to receive a first parameter (a) and a second parameter (b), wherein a and b are positive numbers related to interleaved parameters in a look-up-table (LUT);

code for causing at least one computer to solve a polynomial during turbo decoding to calculate an interleaved address, the polynomial is of order K, wherein the polynomial is solved with a recursive technique that includes a K number of layers of nested loops; and code for causing at least one computer to generate the interleaved address per clock cycle by exploitation of an incremental change of an input of the polynomial.

32. The computer program product of claim 31, the computer readable medium further comprising:

code for causing the at least one computer to employ a first loop that includes:

adding a and b with a first loop clock counter to identify a first result, the clock counter increments to N, N is a positive integer; and utilizing the first result as an input to calculate a first modular result for the polynomial; and code for causing the at least one computer to employ a second loop that includes:

adding the first modular result with a second loop clock counter to identify a second result;

utilizing the second result as an input with N to calculate a second modular result for the polynomial;

adding the second modular result with a and b to produce a third result;

utilizing the third result as an input with N to calculate a third modular result; and employing the third modular result as the interleaved address for the clock cycle N.

33. The computer program product of claim 32, the computer readable medium further comprising code for causing the at least one computer to utilize K−1 number of first loops and the second loop, where K is the order of the polynomial.

34. The computer program product of claim 32, the computer readable medium further comprising code for causing the at least one computer to calculate N amount of interleaved addresses for each clock cycle N.

35. The computer program product of claim 31, wherein the polynomial is [ax+bx$^2$] mod N and K is 2.

36. The computer program product of claim 31, wherein N is an integer between 40 and 6144.

37. The computer program product of claim 31, the computer readable medium further comprising code for causing the at least one computer to receive the interleaved address to at least one of a user equipment, a base station, a serving base station, a target base station, a network, a server, or an eNode B.

38. The computer program product of claim 31, the computer readable medium further comprising code for causing the at least one computer to transmit the interleaved address to at least one of a user equipment, a base station, a serving base station, a target base station, a network, a server, or an eNode B.

39. The computer program product of claim 31, the computer readable medium further comprising code for causing the at least one computer to maintain turbo decoding performance while generating the interleaved address.

40. The computer program product of claim 31, the computer readable medium further comprising:

code for causing the at least one computer to utilize the recursive technique with K layers of nested loops to solve the polynomial and a modular function based upon leverage of the a natural order of information bits into the iterative turbo decoding process being linear; and code for causing the at least one computer to initialize an output of the information bits to 0 which corresponds to an interleaved address of input 0.

* * * * *